United States Patent [19]
Hush et al.

[11] Patent Number: 5,490,112
[45] Date of Patent: Feb. 6, 1996

[54] MULTI-PORT MEMORY DEVICE WITH MULTIPLE SETS OF COLUMNS

[75] Inventors: Glen E. Hush; Stephen L. Casper, both of Boise, Id.

[73] Assignee: Micron Technology, Inc., Boise, Id.

[21] Appl. No.: 323,179

[22] Filed: Oct. 14, 1994

Related U.S. Application Data

[63] Continuation-in-part of Ser. No. 13,897, Feb. 5, 1993, Pat. No. 5,450,355.
[51] Int. Cl.$^6$ .............................. G11C 7/00; G11C 8/00
[52] U.S. Cl. ..................... 365/189.04; 365/230.05; 365/230.09; 365/239
[58] Field of Search ................. 365/189.04, 230.05, 365/221, 230.05, 230.09, 239

[56] References Cited

U.S. PATENT DOCUMENTS

| | | | |
|---|---|---|---|
| 4,825,411 | 4/1989 | Hamano | 365/189 |
| 4,851,834 | 7/1989 | Stockebrand et al. | 340/801 |
| 4,855,959 | 8/1989 | Kobayashi | 365/239 |
| 4,891,794 | 1/1990 | Hush et al. | 365/189.04 |
| 5,065,369 | 11/1991 | Toda | 365/230.05 |
| 5,121,360 | 6/1992 | West et al. | 365/730.03 |
| 5,247,484 | 9/1993 | Watanabe | 365/230.05 |
| 5,265,049 | 11/1993 | Takasugi | 365/189.01 |
| 5,381,376 | 1/1995 | Kim et al. | 365/230.05 |
| 5,418,745 | 5/1995 | Watanabe | 365/230.05 X |

FOREIGN PATENT DOCUMENTS 3-189989  8/1991  Japan .

Primary Examiner—David C. Nelms
Assistant Examiner—Huan Hoang
Attorney, Agent, or Firm—Schwegman, Lundberg & Woessner

[57] ABSTRACT

A multi-port memory device includes a row-column array, a random access port, a plurality of bidirectional serial access memory (SAM) ports, and a switching network for coupling SAM ports to sets of columns. A column is defined as a number of memory cells sharing a sense amplifier. Sets of columns are defined in one rectangular region or among several rectangular regions of the array. The switching network selectively couples each SAM port with each set, each set with each other set, and each SAM port with each other SAM port. A video random access memory (VRAM) or a multi-port dynamic random access memory (DRAM) of the present invention provides increased flexibility in smaller die area.

8 Claims, 8 Drawing Sheets

310

| COLUMN DECODER | 326 |
|---|---|

| | ARRAY | 332 |
|---|---|---|
| ROW DECODER 328 | SENSE AMPLIFIERS | 334 |
| | ARRAY | 336 |
| | ARRAY | 338 |
| | SENSE AMPLIFIERS | 340 |
| | ARRAY | 342 |
| ROW DECODER 330 | ARRAY | 344 |
| | SENSE AMPLIFIERS | 346 |
| | ARRAY | 348 |
| | ARRAY | 350 |
| | SENSE AMPLIFIERS | 352 |
| | ARRAY | 354 |

| TRANSFER GATES | 356 |
|---|---|
| SAM - A | 358 |
| SAM - B | 360 |
| SAM - C | 362 |

FIG. 9

MULTI-PORT MEMORY DEVICE WITH MULTIPLE SETS OF COLUMNS

CROSS REFERENCE TO RELATED APPLICATIONS

This application is a continuation in part application of, and claims priority from, U.S. patent application Ser. No. 08/013,897, filed Feb. 5, 1993, now U.S. Pat. No. 5,450,355.

FIELD OF THE INVENTION

This invention relates to semiconductor memory devices and more particularly to multiple serial access ports for random access memory devices requiring substantially less space on a semiconductor wafer.

BACKGROUND OF THE INVENTION

Dynamic Random Access Memories ("DRAMs") with dual ports first became popular in the mid 1980s. Armed with an additional port to allow for serial input/output access, these devices have been also labeled Video Random Access Memories ("VRAMs") because of their ability to overcome the bottleneck that existed in presenting data to and from the computer screen.

Referring to FIG. 1, an early conventional VRAM design is illustrated. Each VRAM comprises a memory array 10 having a number of memory cells, the number of cells being defined by the number of rows and number of columns in array 10. For example, a 1 megabit array would have 1024 rows and 1024 columns or some combination thereof. Coupled to each cell of array 10 is a random access memory port 20, as in traditional DRAM architecture. Random access memory port 20 allows for the selective access of each cell within array 10. Thus, any cell can be read or written through memory port 20.

To enable a block of stored data to be rapidly accessed, each row from array 10 is coupled to a bidirectional serial access port 30. This serial access port 30, also referred to as a Serial Access Memory ("SAM"), has a number of lines 35 directly corresponding to the number of columns of array 10. As such, using this configuration, a one-to-one relationship exists between the number of columns and the length of SAM 30.

The dual port DRAM design is particularly convenient for video applications because some address sequences, such as pixels in a raster scan, are predetermined. SAM 30 provides a means for reading a row of information from array 10 and serially outputting this data according to a particular scheme. Similarly, a row of information can be serially input to SAM 30, and subsequently written as a unit to the appropriate row of cells within array 10. As such, data may be read from the SAM at DRAM address speeds and serially output through the serial access port, and vice versa. Nonetheless, both a read and a write function of SAM 30 cannot be performed simultaneously.

In order to increase the overall speed of the dual port DRAM (VRAM) design, several architectural alternatives have been examined. One such configuration, corresponding to U.S. Pat. No. 4,891,794 is simply depicted in FIG. 2. Here, inventors Hush et al. employ a second independent bidirectional SAM, SAM-B 40, in addition to the SAM-A 30 of the original VRAM architecture. Like SAM-A 30, SAM-B 40 is independently coupled to each column of array 10, thereby enabling concurrent serial reading from one SAM and serial writing to a second SAM.

The additional SAM has particular advantages in the areas of image acquisition ("frame grabbers") and high speed network controlling and buffering. Without a second SAM, many of these designs must switch the direction of the serial port for input and output. For example, frame grabber video boards acquire images in real time and subsequently manipulate the image data, through filtering, edge detection, etc., or add computer generated information to the captured image, such as text overlay or windows. The composite image can then be output for display purposes. However, all three operations— input, output and processing—cannot be performed simultaneously in real time in a standard VRAM or DRAM. Thus, by adding the second serial access port or SAM, data can be input serially, serially output and displayed, and processed by means of the random access port, all at the same time. This is because all three ports—the random access port and both serial access ports—operate independently and asynchronously of each other, except during an internal transfer of data.

While the design of Hush et al. in U.S. Pat. No. 4,891,794 reaps the benefits of a three port random access memory, it also has several limitations. First, the need to couple each column of array 10 to each line of both SAM-A 30 and SAM-B 40 causes the layout of this circuit to be considerably more sizable than a conventional dual port DRAM architecture. Lines 45 must cross over or under SAM-A for proper coupling with SAM-B. In order to avoid this type of arrangement, circuit designers have repositioned the SAMs, locating one on each side of the memory array as well as divided the array into two equivalent halves.

Moreover, the triple port approach of Hush et al. in U.S. Pat. No. 4,891,794 is limited in terms of its ability to manipulate data serially. The design, though an improvement over the dual port DRAM approach, can serially read and serially write information only from two ports. There is a demand for a greater number of serial ports without substantially increased die size. Further, an enhanced overall speed is substantially needed with the onset of more advanced electronics. These demands are evident in communications applications of VRAM devices.

In large memory devices, connecting lines that run comparatively long distances on the die exhibit comparatively large capacitance and therefore are unacceptable for low power, high speed devices. As the demand for memory circuits having ever larger numbers of storage cells increases, memory device designers conventionally arrange memory array circuits in multiple sections, i.e. partitioned subsystems, called subarrays. Each such subarray conventionally includes a portion of the memory array as well as local decoding, sensing, and switching circuits that operate in parallel with other similar circuits in other subarrays. Though logically redundant, these local circuits avoid the need for long interconnections for high speed signaling. However, memory device architectures that employ considerable local circuitry suffer from lack of die surface area for additional and larger subarrays, consume too much power for important applications including battery powered and portable devices, and suffer from disadvantages associated with long interconnecting lines between circuit elements.

In view of the problems described above and related problems that consequently become apparent to those skilled in the applicable arts, the need remains in memory devices for an improved multi-port memory device.

SUMMARY OF THE INVENTION

The primary object of the present invention is to eliminate the aforementioned drawbacks of the prior art.

Another object of the present invention is to provide a multi-port DRAM requiring less space on a semiconductor wafer.

A further object of the present invention is to provide a multi-port DRAM having improved performance characteristics.

Yet another object of the present invention is to provide a multi-port DRAM architecture having greater flexibility.

In order to achieve these objects, as well as others which will become apparent hereafter, a multi-port memory device of the present invention comprises a memory array having a plurality of cells for storing data, the array being defined by a number of rows and a number of columns. In a first embodiment, the number of columns of the array is further defined by a plurality of sets, where there is at least a first set and a second set. A random access memory port for accessing data is coupled to the array, such that the random access memory can selectively access each cell of the array. The device further comprises a plurality of bidirectional serial access memory ("SAM") ports for serially accessing data. The number of SAM ports being equal to the number of sets. A switching network is incorporated for selectively coupling each SAM port with each set, each set with each other set, and each SAM port with each other SAM port. The switching network is realized by means of a plurality of transfer and switching gates.

In one embodiment of the present invention, the multi-port memory device comprises one decoder for selecting an order for data to be accessed through each SAM port. Each SAM port comprises a latch for storing accessed data and a shift register for providing the order of the data to be accessed through the latch. Each shift register is coupled to its respective latch, as well as the decoder.

In alternate embodiments, each SAM port comprises both a latch for storing serially accessed data and a pointer for selecting the order in which the data is to be accessed through the latch. In another embodiment, each SAM port solely comprises a shift register for accessing the data.

In yet another embodiment, a set of columns in a multi-port memory is coupled to multiple SAMs via a bus and the bus is coupled to each SAM through a switch.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE DRAWINGS

FIG. 9 is a top view of a portion of the substrate of a multi-port memory of the present invention.

A person having ordinary skill in the art will recognize where portions of a diagram have been expanded to improve the clarity of the presentation.

In each functional block diagram a group of signals having no binary coded relationship is shown as a single line. A single line between functional blocks represents one or more signals.

DETAILED DESCRIPTION OF THE INVENTION

Figure 1:
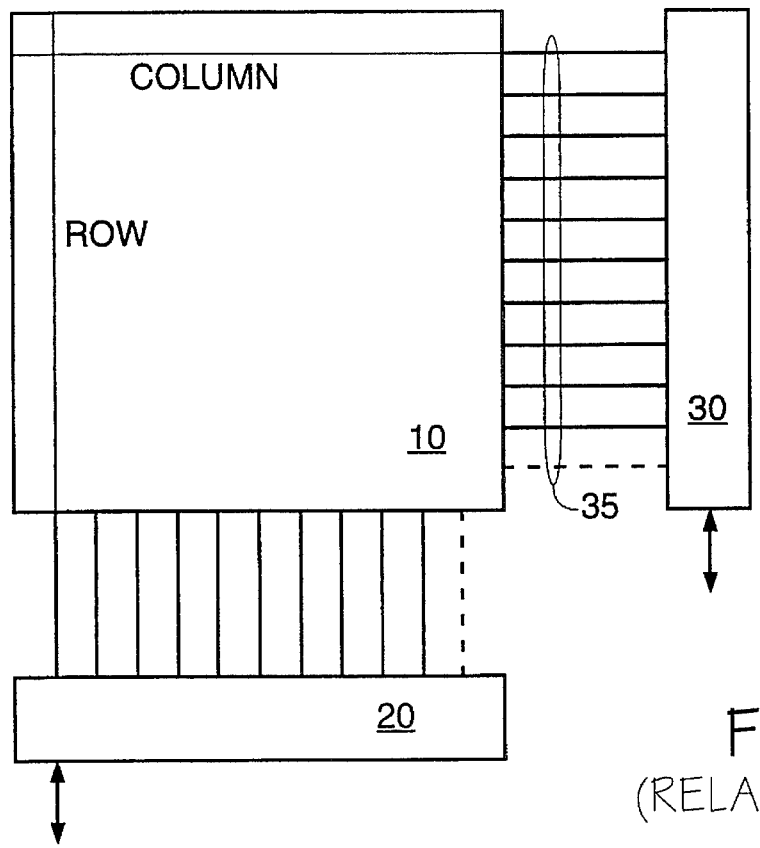
FIG. 1 is an illustration of the traditional architecture associated with a dual port dynamic random access memory.
Figure 2:
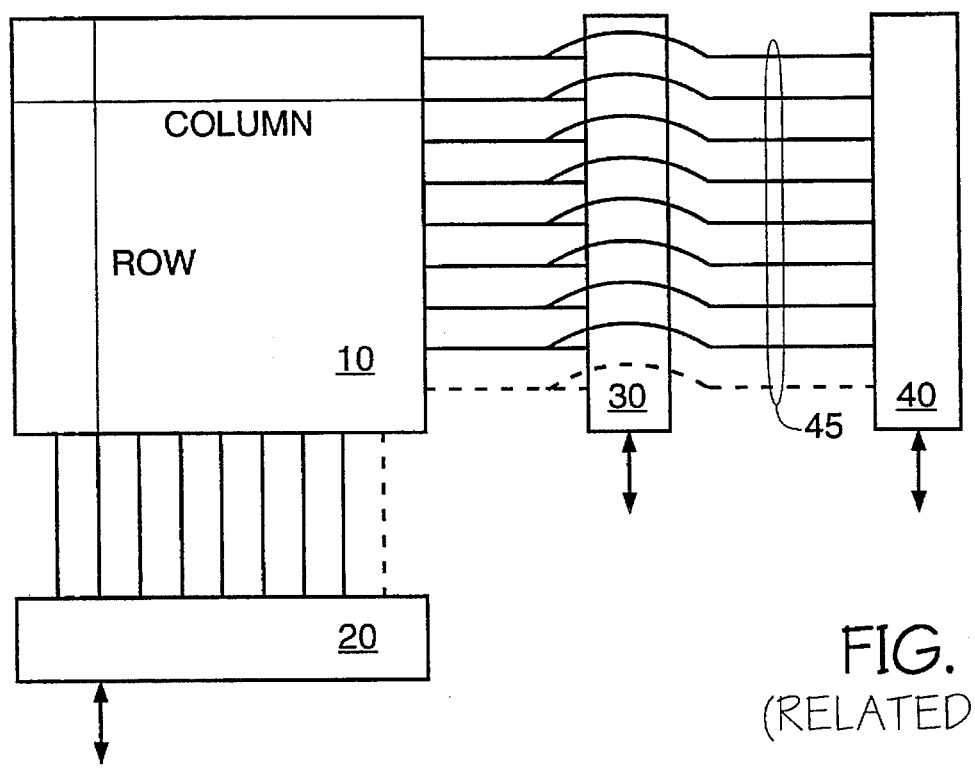
FIG. 2 is an illustration of the traditional architecture associated with a triple port dynamic random access memory.
Figure 3:
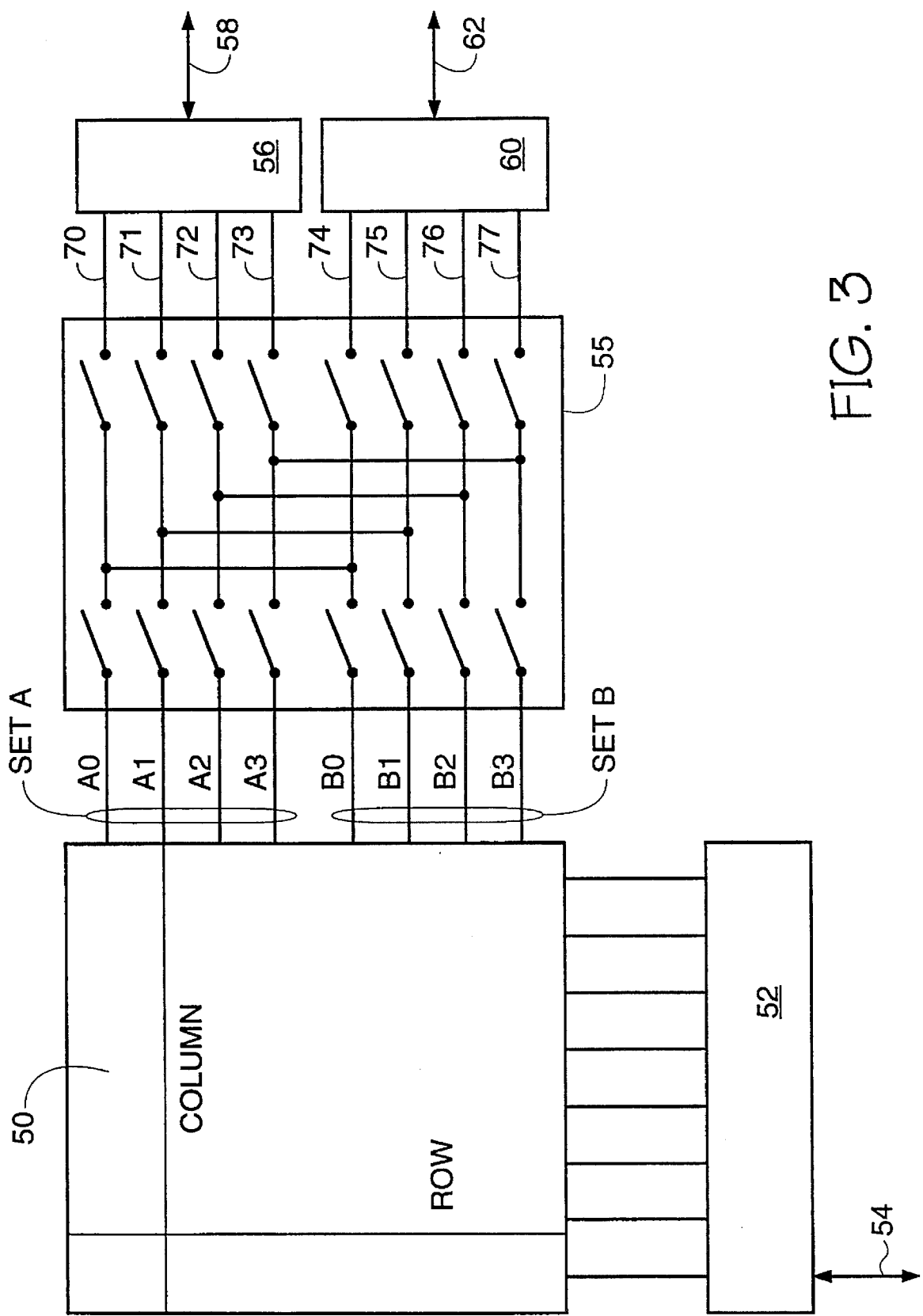
FIG. 3 is a block diagram of a multi-port memory of the present invention.

An array of memory cells 50 is illustrated in FIG. 3. Array 50 is defined by a predetermined number of rows and a predetermined number of columns. In FIG. 3, the array depicted comprises 8 rows and 8 columns, and thus 64 memory cells. It should be obvious to one of ordinary skill in the art that the present invention need not be limited to these number of rows and columns in order to operate properly.

Coupled to each row and each column of array 50 is random access memory ("RAM") port 52. RAM port 52, by means of an addressing scheme, control logic, and digital circuitry (not shown), accesses any cell of array 50. The cell accessed can be read from or written to, depending on the mode of operation of RAM port 52. The read/write interface of RAM port 52 includes RAM port input/output ("I/O") signals 54. RAM port 52, its associated signals, and operation are of the conventional type described in U.S. Pat. No. 4,891,794 and U.S. patent application Ser. No. 08/049,275, filed Apr. 20, 1993.

In order to serially access array 50, a number of bidirectional serial access memories ("SAMs") are employed. In traditional architecture, each row is coupled to one or more SAMs. However, in one embodiment of the present invention, the number of columns of array 50 is divided into sets. The number of sets thereby established directly relates to the number of SAMs employed.

In FIG. 3, the 8 columns in array 50 are divided into two sets: set A and set B. Set A comprises columns 0 through 3 (A0–A3), while set B comprises columns 4 though 7 (B0–B3). Directly corresponding to the division of columns 0 through 7 into set A and set B, are a first and second SAM: SAM-A 56 and SAM-B 60. The lengths of SAM-A 56 and SAM-B 60, in the preferred embodiment of the present invention, are equal to the number of columns in set A and the number of columns in set B, respectively, in the preferred embodiment of the present invention. In light of the lengths of SAM-A 56 and SAM-B 60, the number of columns in set A and set B are also equal.

To fully take advantage of the performance of a multi-port architecture, the columns in set A are coupled with SAM-A 56, and the columns in set B are coupled with SAM-B 60 by means of a switching network 55. Moreover, the columns of set A are coupled with SAM-B 60, and the columns of set B are coupled with SAM-A 56 by means of switching network 55. Using this arrangement, either set of columns can be accessed by an available SAM.

Each SAM is selectively coupled to each other SAM by means of switching network 55. Thus, the data in SAM-A is directly transferable to SAM-B and vice versa. For example, when enabled, lines 70–73 are coupled to their respective counterparts (lines 74–77) in SAM-B: line 70 with line 74, line 71 with line 75, line 72 with line 76, and line 73 with line 77.

Each set of columns of a row are selectively coupled to each other set of columns by means of switching network 55. Thus, the data in set A of a particular row is directly transferable to set B of that same row or vice versa. For example, when enabled, columns A0–A3 are coupled to their respective counterparts, columns B0–B3: column A0 with B0, column A1 with B1, column A2 with B2, and column A3 with B3.

The foregoing flexibility of the present architecture is provided in part by switching network 55. Switching network 55 provides a means for transferring data between SAMs, between sets, between set A and SAM-A, between set B and SAM-B, between set A and SAM-B, and between set B and SAM-A. To perform all these functions, switching network 55 includes transfer and switching gates (not shown).

As SAM-A 56 and SAM-B 60 both comprise a serial input/output ("I/O") interface, 58 and 62, respectively, for reading and writing, the present architecture provides a multi-port architecture. SAM ports 56 and 60, including associated reading and writing signals and operation, are of the type described in U.S. Pat. No. 4,891,794 and U.S. patent applications Ser. No. 08/069,967 filed May 28, 1993 and Ser. No. 08/153,120 filed Nov. 15, 1993.

However, unlike the conventional multi-port approach, the present invention requires much less space, as the length of each SAM directly correlates to the number of columns in each set. These savings, in comparison with the conventional multi-port architecture, enable the overall die size to be reduced up to 50 percent for a device comprising eight (8) serial ports.

Figure 4:
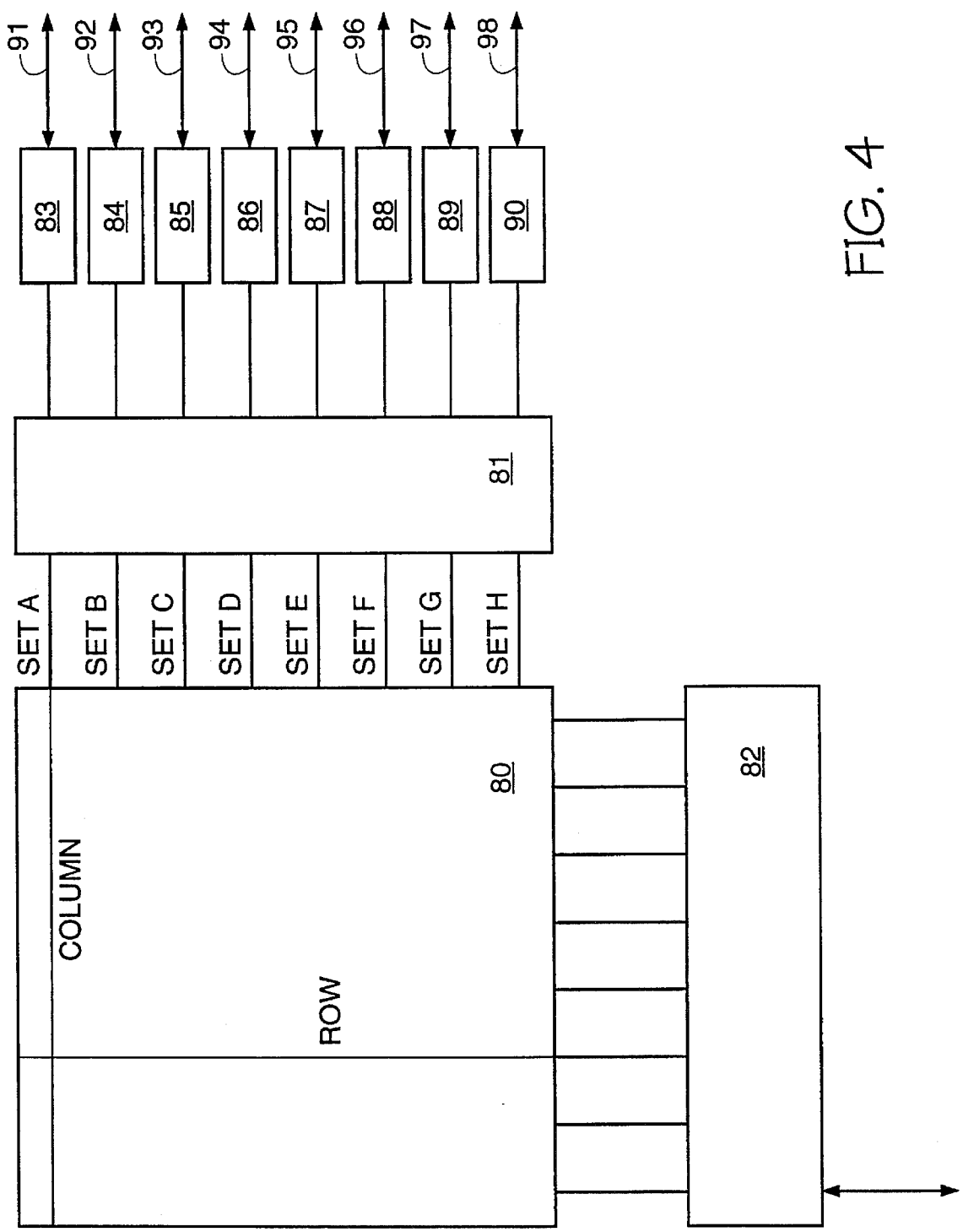
FIG. 4 is a block diagram of a multi-port memory in another embodiment of the present invention.

Referring to FIG. 4, an alternate multi-port architecture relying on the fundamental principles illustrated in FIG. 3 is shown. An array of memory cells 80 defined by a number of rows and a number of columns is shown. The number of columns in array 80 are divided into eight sets: sets A, B, C, D, E, F, G, and H. Coupled to each row and each column of array 80 is a RAM port 82 for accessing each cell. Further, eight independent bidirectional SAMs: SAM-A 83, SAM-B 84, SAM-C 85, SAM-D 86, SAM-E 87, SAM-F 88, SAM-G 89, and SAM-H 90 are each coupled with each set of columns by means of switching network 81. Similar to switching network 55 in FIG. 3, switching network 81 enables any set of columns to be selectively coupled to any SAM, any SAM to be selectively coupled with any other SAM, and any set of columns to be selectively coupled with any other set of columns. Further, each SAM: SAM-A 83, SAM-B 84, SAM-C 85, SAM-D 86, SAM-E 87, SAM-F 88, SAM-G 89, and SAM-H 90 comprises a serial input/output ("I/O") interface 91–98, respectively, for reading and writing.

Figure 5:
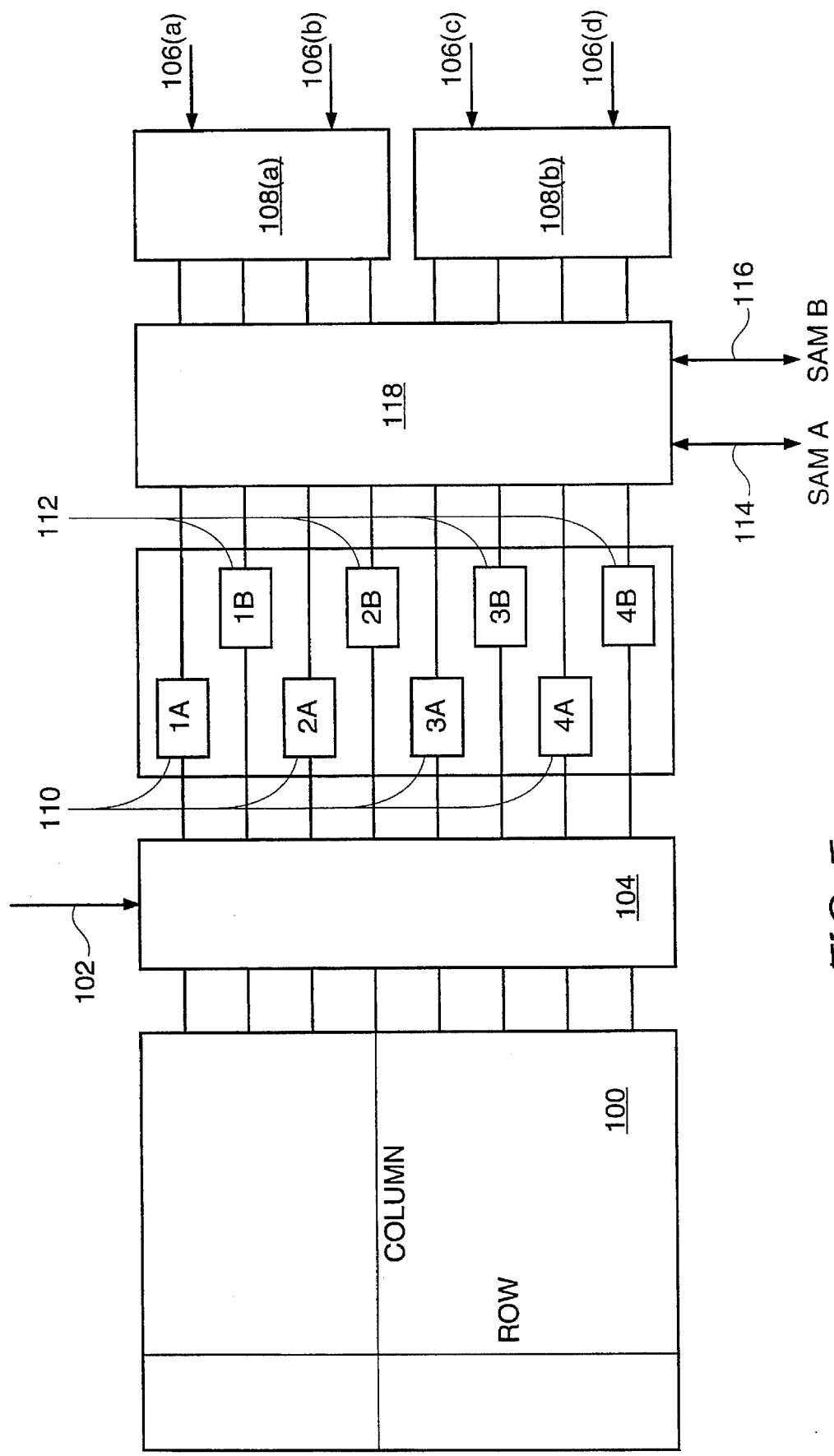
FIG. 5 is a block diagram of a multi-port memory in another embodiment of the present invention.

Referring to FIG. 5, one hardware realization of the present invention is illustrated. An array of memory cells 100 defined by a number of rows and a number of columns is shown. The number of columns in array 100 are divided into set A and set B. Each set of columns is coupled to a series of latches, 110 or 112, by means of switching network 104. Switching network 104 enables each set of columns to be selectively coupled with each series of latches, each series of latches to be selectively coupled with the other series of latches, and any set of columns to be selectively coupled with any other set of columns. A series of control signals 102 facilitate this selective coupling. Furthermore, each series of latches, 110 and 112, are coupled to a pointer/decoder, 108(a) and 108(b), respectively, by means of switching network 118. Switching network 118 provides serial access I/O lines 114 and 116 for each set of columns. A series of control signals, 106(a) and 106(b) with respect to pointer/decoder 108(a), and 106(c) and 106(d) with respect to pointer/decoder 108(b), enables each pointer/decoder 108(a) and 108(b) to determine which data is to be read from a series of latches in one mode of operation, and in another mode of operation, the location the data is to be written.

Figure 6:
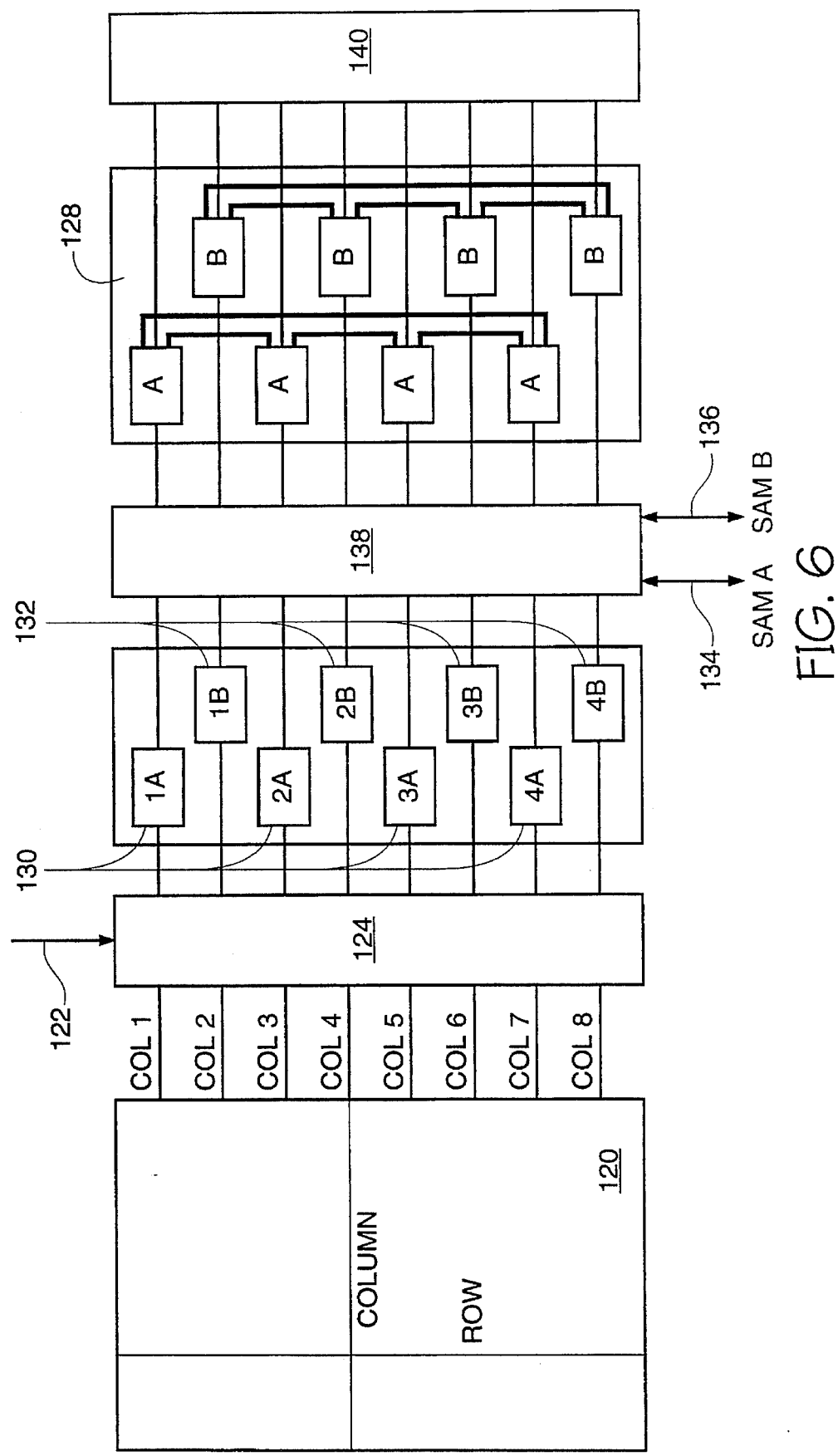
FIG. 6 is a block diagram of a multi-port memory in another embodiment of the present invention.

FIG. 6 is a preferred realization of one embodiment of the present invention. An array of memory cells 120 defined by a number of rows and a number of columns is shown. The number of columns in array 120 is divided into set A and set B. Each set of columns is coupled to a series of latches, 130 or 132, by means of switching network 124. Switching network 124 enables each set of columns to be selectively coupled with each series of latches, each series of latches to be selectively coupled with the other series of latches, and any set of columns to be selectively coupled with any other set of columns. Control signals 122 facilitate this selective coupling. Furthermore, both series of latches, 130 and 132, are coupled to shift register 128 (also known as a "bucket brigade") by means of switching circuitry 138. Shift register 128 is also coupled to a decoder 140, which loads a starting access location. Having been loaded with a start location, shift register 128 points to the appropriate column of the set which is to be written or read through switching circuitry 138. Serial access I/O lines 134 and 136, by means of switching circuitry 138, are provided as a read/write interface for each set of columns.

While the realization of FIG. 6 may appear to be more complex because of the need for additional circuitry, it is preferred. This realization is preferred because the realization of FIG. 5 requires a pointer/decoder for each set of columns; for example, 8 pointer/decoders for 8 sets of columns. In contrast, the realization of FIG. 6 requires only one shift register and tap load decoder, irrespective of the number of sets of columns. It should be obvious to one of ordinary skill in the art that the present invention can also be realized solely by means of a shift register. However, utilizing such realization, the overall system performance is slowed because of the lack of a pointer for identifying the data to be input/output.

Figure 7:
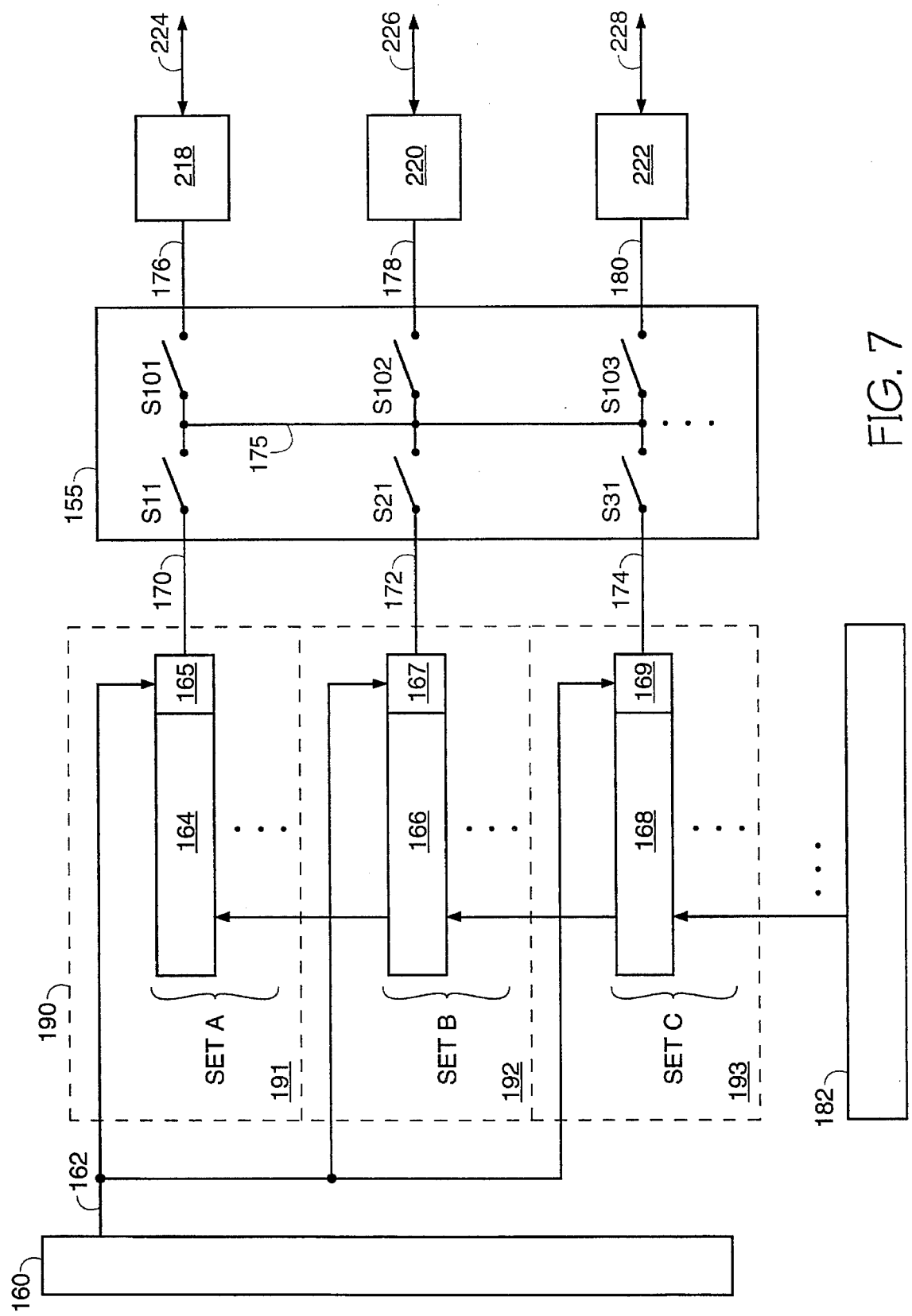
FIG. 7 is a partial block diagram of a first realization of the embodiment shown in FIG. 3.

FIG. 7 is a partial block diagram of a first realization of the embodiment shown in FIG. 3. While in FIG. 3, two sets of 4 columns are shown for cooperation with two SAM ports, in FIG. 7, one column of each of three sets of columns is shown for cooperation with three SAM ports. In FIG. 7, only one column of each set is shown for clarity; ellipsis indicate where a regular feature of the design is repeated. The multi-port memory of FIG. 7 is formed on a substrate (not shown) and includes column decoder 160, sense amplifier enable line 162, switching network 155, bidirectional serial access memory SAM-A 218 having serial I/O interface 224, serial access memory SAM-B 220 having serial I/O interface 226, and serial access memory SAM-C having serial I/O interface 228.

The multi-port memory shown in FIG. 7 is arranged on the substrate according to an aspect of the present invention. The cells of the row-column array of multi-port the memory shown in FIG. 7 are formed on the substrate in three regions 191, 192, and 193. In a first embodiment, row decoder 182 operates to simultaneously identify a cell in each column of sets A, B, and C. In a second embodiment, row decoder 182 provides terms to a first row subdecoder for set A, to a second row subdecoder for set B, and to a third row subdecoder for set C. Use of row subdecoders (not shown) is well known in the art for reducing the length of interconnection lines, reducing the capacitance associated with interconnection lines, and for increasing the speed of memory access. Such row subdecoders are placed adjacent to or centrally within the array in each region 191 through 193. As shown in FIG. 7, all switches of switching network 155 are located outside the regions 191, 192, and 193 wherein cells of the array are formed. In a similar fashion, SAMs 218 through 222 are formed outside regions 191, 192, and 193. Other features of the inventive arrangement are best understood by exemplary embodiments.

In a first exemplary embodiment, regions 191 through 193 are substantially rectangular having two sides and two ends. In this embodiment, regions 191 through 193 are placed side by side in one contiguous region 190; column decoder 160 is formed on the left end of region 190; and switching network 155 is placed at the opposite, right, end. SAM-A 218 is placed to the right of switching network 155; SAM-B 220 is placed to the right of SAM-A 218; and SAM-C 222 is placed to the right of SAM-B. Because regions 191 through 193 are contiguous, in one variation, there is no physical or electrical separation of adjacent regions. In a second variation, row subdecoders either physically or electrically distinguish adjacent regions from each other. In this first exemplary embodiment, region 190 incudes all cells of the multi-port memory.

In a second exemplary embodiment, the circuitry shown in FIG. 7 is duplicated many times and intercoupled to form a large multi-port memory having subarrays each corresponding to region 190. Such use of subarrays is well known in the art for obtaining benefits similar to those discussed above with reference to subdecoders. In one variation on this second exemplary embodiment, one column decoder provides terms to a first column subdecoder for set A, to a second column subdecoder for set B, and to a third column subdecoder for set C. Use of column subdecoders is well known in the art for reducing the length of interconnection lines, reducing the capacitance associated with interconnection lines, and for increasing the speed of memory access.

In operation of the embodiment shown and exemplary embodiments discussed above, column decoder 160 provides a signal on line 162 for selecting a member column of each set by enabling the sense amplifier associated with each selected column. A column is defined as a group of memory cells that share a common sense amplifier. Thus, column 164 includes a cell for each of a plurality of rows; and, each cell of column 164 is coupled to sense amplifier 165. Similarly, cells in columns 166 and 168 are coupled to sense amplifiers 167 and 169, respectively. Switching network 155 is of the type described as switching network 55 in FIG. 3. SAMs 218 through 222 are and I/O interfaces 224 through 228 are of the type described as similarly named items in FIG. 3.

Figure 8:
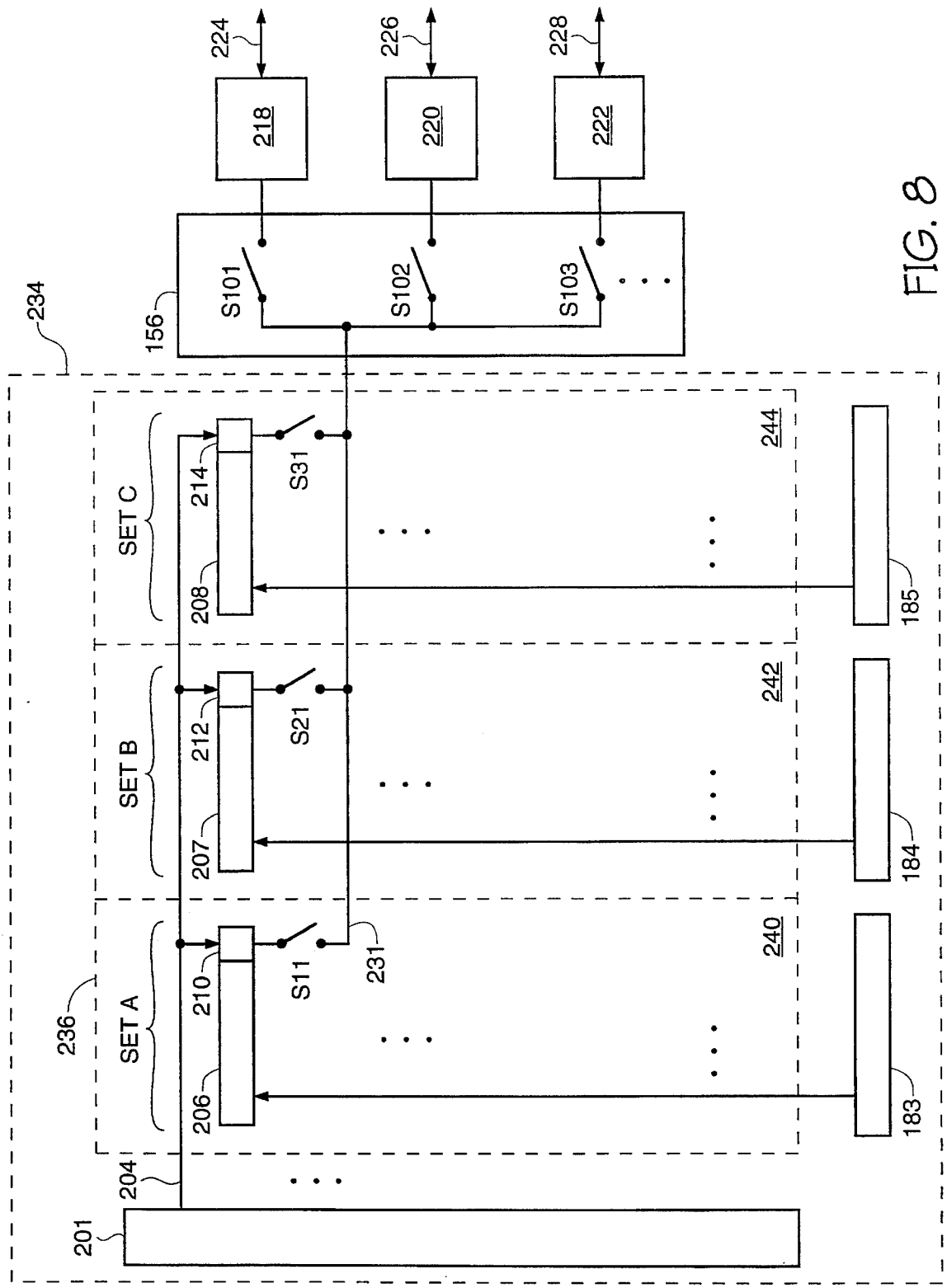
FIG. 8 is a partial block diagram of a second realization of the embodiment shown in FIG. 3.

FIG. 8 is a partial block diagram of a second realization of the embodiment shown in FIG. 3. The multi-port memory of FIG. 8 includes column decoder 206, substantially rectangular regions 240 through 244 placed side by side in a contiguous region 236, a subarray in each region 240 through 244, a row subdecoder 183 through 185 for each subarray, respectively, switching network 156, SAMs 218 through 222 and serial I/O interfaces 224 through 228. The structure and operation of circuits shown in FIG. 8 are identical to those in FIG. 7, as to similarly numbered elements already discussed.

Column decoder 206 provides a signal on line 204 for selecting a member column of each set by enabling the sense amplifier associated with each selected column. Thus, column 206 includes a cell for each of a plurality of rows identified by row subdecoder 183; and, each cell of column 206 is coupled to sense amplifier 210. Similarly, cells in columns 207 and 208 are coupled to row subdecoders 184 and 185 and to sense amplifiers 212 and 214, respectively.

In addition to the features similar to FIG. 7, the multiport memory illustrated in FIG. 8 includes global switch bus 231. Electrically and functionally global switch bus 231 is identical to switch bus 175 shown in FIG. 7. However, the functions of switching network 155 in FIG. 7 are performed by switching network 156, placed outside contiguous region 236 in cooperation with global column bus 231 and switches S11, S21, and S31.

In contrast to the embodiment shown in FIG. 7, the embodiment of FIG. 8 provides a functionally similar architecture on a substrate smaller than the substrate required for the embodiment of FIG. 7. In the second exemplary embodiment discussed with reference to FIG. 7, multiple contiguous regions were separated by placements of switching network 155 and SAMs 218 through 222. In a first embodiment according to FIG. 8, on the other hand, a number of subarrays 240 through 244 are located within an array region 234 being placed adjacent to each other (end-to-end, side-by-side, or both). In this first embodiment switching network 156 and SAMs 218 through 222 are located outside array region 234.

In a second embodiment according to FIG. 8, a number of contiguous regions 236 are located within an array region 234. In one variation of such an embodiment, all memory cells of the multi-port memory are located within region 234 so that SAMs 218 through 222 are placed apart from all memory cells. In another variation, a multi-port memory having a large number of cells is arranged in substantially rectangular strips (not shown) wherein each strip includes a column decoder, a plurality of sets of columns arranged within a region 234, and a multiplicity of global column buses that pass over (under, through, or around) adjacent subarrays for connection to peripheral circuitry including switching network 156 and SAMs 218 through 222.

FIG. 9 is a top view of a portion of the substrate of a multi-port memory of the present invention. Substrate 310 includes a substantially rectangular region characterized by circuit regions corresponding to functional blocks. The arrangement of circuit regions as shown provides memory cells in high density subarrays, for example, 332, 336, 338, 342, 344, 348, 350, and 354. Each subarray includes a row and column arrangement of memory cells. As shown, columns are vertical and rows are horizontal. Hence, column subdecoder 326 can enable a sense amplifier in each vertical column by column lines extending through (over or under) cells in the subarrays.

Sense amplifiers, for example, 334, 340, 346, and 352, are coupled to the column lines and placed beside and between subarrays to maintain short conductor paths, decrease capacitance, and improve reliable response time. Thus, for instance, data in cells of subarrays 332 and 336 are sensed primarily by sense amplifiers 334.

Row subdecoders 328 and 330 are arranged beside subarrays. Row lines extend from row subdecoders through (over or under) cells of the subarrays. Each cell of each array is coupled to a row line so that data in a cell at the intersection of an active row line and an active column line is accessed for read, write, or transfer operations.

Circuitry described with reference to earlier figures is located in transfer gate region 356. For example in the embodiments shown in FIGS. 3 through 8 switching networks 55, 81, 104, 124, 155, and 156 respectively are located in region 356.

Substrate 310 is shown with three SAM regions 358, 360 and 362. By arranging SAM regions apart from all subarrays, the advantages of the present invention as discussed above are realized. In a preferred embodiment, bus 231 as shown in FIG. 8 extends vertically over cells in subarrays 354, 350, 348, 344, 342, 338, and 336 for coupling to sense amplifiers 352, 346, 340, and 334.

Many alternate substrate embodiments lie within the scope of the present invention. For example, in an alternate embodiment, subarrays 336, 342, 348, and 354 are eliminated. In still another alternate embodiment more or fewer SAM circuit regions are placed in the area generally occupied by SAM circuits 358, 360, and 362. In one embodiment region 362 is eliminated for a memory having only two SAM circuit regions. In another embodiment five additional regions are located beyond region 362 for a total of eight SAM circuit regions.

While the particular invention has been described with reference to illustrative embodiments, this description is not meant to be construed in a limiting sense. It should be obvious to one of ordinary skill in the art that alternate configurations of the present architecture could be devised to promote the present invention. As such, it is understood that although the present invention has been described in a preferred embodiment, various modifications of the illustrative embodiments, as well as additional embodiments of the invention, will be apparent to persons skilled in the art upon reference to this description without departing from the spirit of the invention, as recited in the claims appended hereto. It is therefore contemplated that the appended claims will cover any such modifications or embodiments that fall within the true scope of the invention.

All of the U.S. Patent documents cited herein are hereby incorporated by reference as if set forth here in their entirety.

The foregoing description discusses preferred embodiments of the present invention, which may be changed or modified without departing from the scope of the present invention.

The words and phrases used in the claims are intended to be broadly construed. A "system" refers generally to electrical apparatus and includes but is not limited to a packaged integrated circuit, an unpackaged integrated circuit, a combination of packaged or unpackaged integrated circuits or both, a microprocessor, a microcontroller, a memory, a register, a flip-flop, a charge-coupled device, combinations thereof, and equivalents.

A "signal" refers to mechanical and/or electromagnetic energy conveying information. When elements are coupled, a signal is conveyed in any manner feasible with regard to the nature of the coupling. For example, if several electrical conductors couple two elements, then the relevant signal comprises the energy on one, some, or all conductors at a given time or time period. When a physical property of a signal has a quantitative measure and the property is used by design to control or communicate information, then the signal is said to be characterized by having a "value." The amplitude may be instantaneous or an average. For a binary (digital) signal, the two characteristic values are called logic levels, "high" and "low."

What is claimed is:

1. A multi-port memory comprising:
   a. a dynamic random access memory array, the array comprising a first, a second, and a third set of columns each column comprising a sense amplifier, the first set comprising a predetermined number of columns, the second and the third set comprising the predetermined number of columns;
   b. a random access circuit coupled to the array, the random access circuit comprising a column decoder for concurrently enabling a sense amplifier from each set;
   c. a first, a second, and a third serial access circuit coupled to the array, the first, the second, and the third serial access circuit respectively comprising a first, a second, and a third plurality of serial access memory cells and a first, a second, and a third pointer decoder for enabling serial access of a serial access memory cell of the respective plurality; and
   d. a switching circuit comprising a plurality of buses equal in number to the predetermined number, a plurality of first transfer gates for coupling the enabled sense amplifiers to a selected bus of the plurality of buses, and a plurality of second transfer gates for coupling the selected bus to the enabled serial access memory cells.

2. The multi-port memory of claim 1 wherein the column decoder is coupled by a column decode bus to each sense amplifier, the column decoder for enabling sensing by the first, the second, and the third enabled sense amplifier.

3. The integrated circuit of claim 1 wherein:
   a. the first, the second, and the third set of columns are disposed within a first region, the first region comprising a first, a second, and a third subregion, the first set being disposed within the first subregion, the second set being disposed within the second subregion, and the third set being disposed within the third subregion;
   b. the first, the second, and the third serial access memory circuits are disposed outside the first region;
   c. the column decoder is coupled to the first, the second, and the third enabled sense amplifiers by a column decode bus; and
   d. the column decode bus comprises a first, a second, and a third portion disposed respectively in the first, the second, and the third subregions.

4. The multi-port memory of claim 1 wherein the first, the second, and the third set of columns are disposed within a first region and the first, the second, and the third serial access memory circuits are disposed within a second region.

5. The multi-port memory of claim 4 wherein the switching circuit comprises:
   a. a first transfer gate of the plurality of first transfer gates disposed within the first region for coupling the enabled sense amplifier of the first set to the selected bus of the plurality of buses; and
   b. a second transfer gate of the plurality of second transfer gates disposed outside the first region for coupling the selected bus to the enabled serial access memory cell of the first serial access memory circuit.

6. The multi-port memory of claim 5 wherein the first region comprises a first, a second, and a third subregion, the first set being disposed within the first subregion, the second set being disposed within the second subregion, and the third set being disposed within the third subregion.

7. The multi-port memory of claim 6 wherein the selected bus comprises a first portion disposed in the first subregion, a second portion disposed in the second subregion, and a third portion disposed in the third subregion.

8. The multi-port memory of claim 6 wherein:
a. each column further comprises a plurality of memory cells; and
b. each plurality of memory cells is coupled to a row decoder disposed within each subregion, the row decoder for coupling for each column a memory cell selected from the plurality of memory cells to the sense amplifier.

* * * * *